United States Patent
Bhandari

(10) Patent No.: US 6,240,543 B1
(45) Date of Patent: May 29, 2001

(54) INTEGRATION OF MANUFACTURING TEST OF MULTIPLE SYSTEM ON A CHIP WITHOUT SUBSTANTIAL SIMULATION

(76) Inventor: Narpat Bhandari, 14530 Deer Park Ct., Los Gatos, CA (US) 95032

( * ) Notice: Subject to any disclaimer, the term of this patent is extended or adjusted under 35 U.S.C. 154(b) by 0 days.

(21) Appl. No.: 09/201,739

(22) Filed: Dec. 1, 1998

(51) Int. Cl.$^7$ .............................. G06F 17/50; G06F 19/00
(52) U.S. Cl. .................... 716/18; 716/16; 716/5; 702/120; 703/16; 324/750; 324/763; 324/765
(58) Field of Search ..................... 716/1–21; 703/14–16; 702/117–120; 324/750, 763, 765

(56) References Cited

U.S. PATENT DOCUMENTS

| | | | |
|---|---|---|---|
| 4,084,869 | * 4/1978 | Yen .......................................... | 439/70 |
| 4,125,763 | * 11/1978 | Drabbing et al. ....................... | 714/27 |
| 4,937,827 | * 6/1990 | Beck et al. .............................. | 714/33 |
| 5,109,353 | 4/1992 | Sample et al. .......................... | 716/17 |
| 5,224,055 | * 6/1993 | Grundy et al. .......................... | 716/11 |
| 5,325,309 | * 6/1994 | Halaviati et al. ....................... | 703/15 |
| 5,452,239 | * 9/1995 | Dai et al. ................................ | 703/19 |
| 5,625,580 | * 4/1997 | Read et al. ............................. | 703/21 |
| 5,627,842 | * 5/1997 | Brown et al. ........................ | 714/727 |
| 5,663,900 | 9/1997 | Bhandari et al. ....................... | 703/20 |
| 6,006,022 | * 12/1999 | Rhim et al. ............................. | 716/1 |
| 6,131,079 | * 10/2000 | Smith ..................................... | 703/13 |

FOREIGN PATENT DOCUMENTS

363127169A * 5/1988 (JP) ............................... G01R/31/28

OTHER PUBLICATIONS

Berekovic et al. ("A core generator for fully synthesizable and highly parameterized RISC–cores for system–on–chip designs", 1998 IEE Workshop on Signal Processing Systems, 1998, SIPS 98, Oct. 8, 1998, pp. 561–568).*

Pichon et al. ("Mixed–signal modelling in VHDL for system–on–chip applications", Proceedings of European Design and Test Conference, 1995, ED&TC, Mar. 6, 1995, pp. 218–222).*

Kirovski et al. ("Functional debugging of systems–on–chip", Digest of Technical Papers, 1998 IEEE/ACM International Conference on Computer–Aided Design, 1998, ICCAD 98, Nov. 8, 1998, pp. 525–528).*

Wanzenried ("Structured board level simulations using Verilog", International Verilog HDL Conference, 1994, Mar. 14, 1994, pp. 29–36).*

* cited by examiner

Primary Examiner—Matthew Smith
Assistant Examiner—Phallaka Kik

(57) ABSTRACT

A system for intergrating other intergrated circuits that doesn't require simulation of the intergrated circuits being intergrated, while achieving adequate test capability. A methodology, tool set and system is described to produce this. Manufacturing test of the single intergrated resultant circuit leverages the manufacturing test capabilities of the devices being intergrated and optimizes the overall test approach.

8 Claims, 1 Drawing Sheet

INTEGRATION OF MANUFACTURING TEST OF MULTIPLE SYSTEM ON A CHIP WITHOUT SUBSTANTIAL SIMULATION

TECHNICAL FIELD OF THE INVENTION

The present invention relates to computer-aided design tools and techniques for design, implementation, and simulation of complex circuits and systems particularly digital devices, modules and systems.

BACKGROUND OF THE INVENTION

Process Technology density in 1998 is 8 million gates and increasing at 60% more each year. Design productivity is at about 1 million gates and increasing at 20% each year. The gap between the two is widening. New capabilities are needed to dramatically improve design productivity.

Many existing integrated circuits can be integrated into very large integrated circuits (SOC or Systems on a Chip) to use the available silicon densities. The key is to have a productivity improvement in the migration of the existing integrated circuits in to SOC.

Present day state-of-the art design technique, uses simulation models of the Integrated Circuits, translates these models to various levels down to the level where silicon can be manufactured. The levels are RTL (Register Transfer Level), gate, or transistor. Simulation is inadequately slow at 300,000 gates, and intolerable at 1 million gates.

Many existing integrated circuits do not have accurate RTL models. If the RTL models do exist, it is a long path to fully integrated silicon, as synthesis needs to be redone, test needs to be redone. Manufacturing test is key to success of SOC.

The traditional methods are slow and arduous for SOC, provide little leverage of existing integrated circuit design, and do not provide for a non-functional simulation flow.

BRIEF SUMMARY OF THE INVENTION

This invention is a system and method for developing SOC rapidly, leveraging existing integrated circuits, promoting the greatest benefits of Intellectual Property integration and re-use with the shortest design cycle.

There are three key steps in the flow. The first step is developing the test model for the SOC. The second step is taking the refined test model to layout and doing the physical design migration of the chips to cores using existing re-layout tools. The third step prepares the SOC for fabrication, fabrication is done, and the SOC is used in a target board. This enables a full SOC development sourced from existing chips, done without functional simulation.

DETAILED DESCRIPTION OF THE INVENTION

Figure 1:
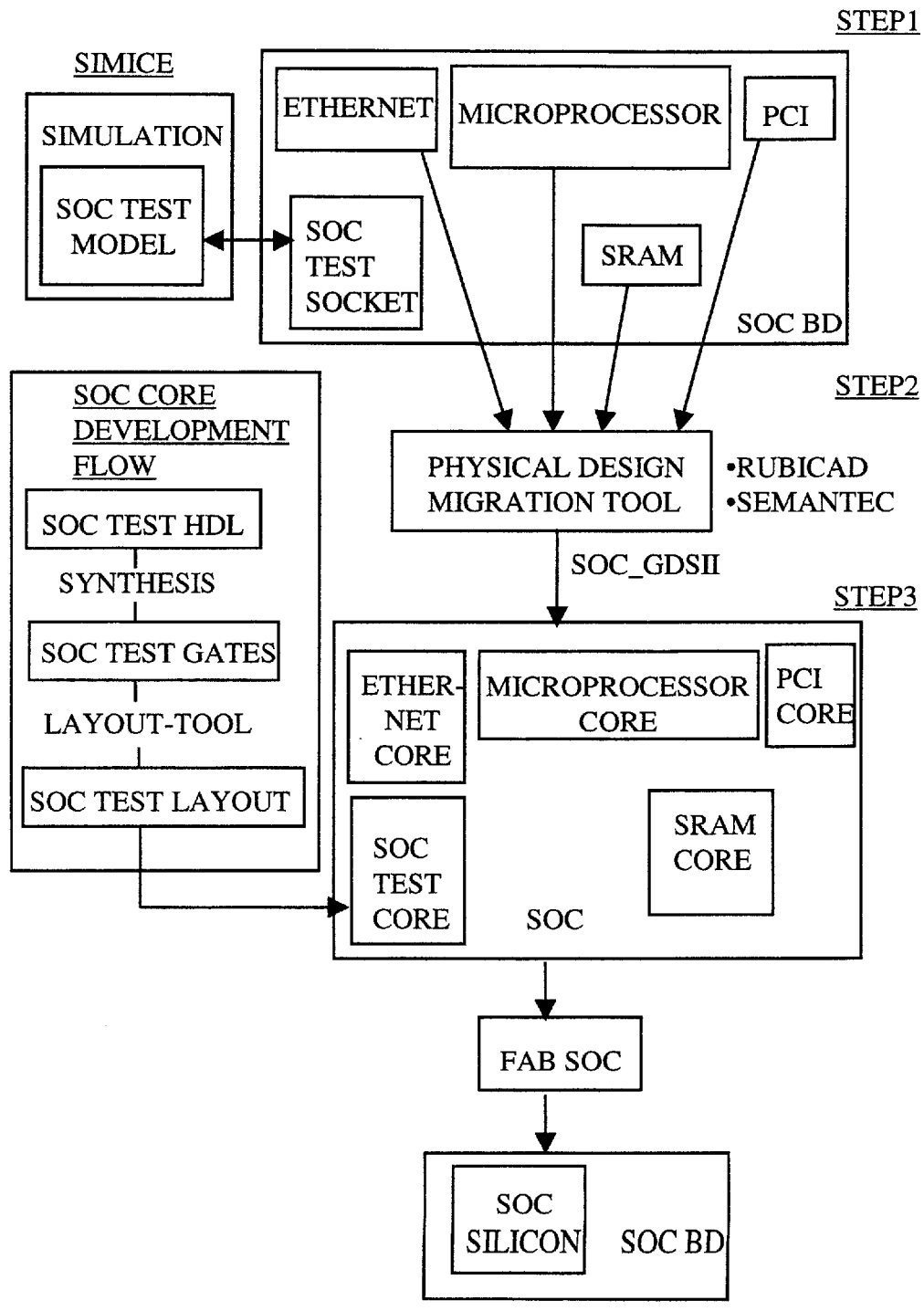
FIG. 1 is a detailed block diagram of an embodiment of the present invention.

The invention requires no functional simulation and test is done systematically and fast, realizing significant savings in time and resources.

Reference Vasona Systems U.S. Pat. No. 5,663,900. This will be referred to here as SimICE. Vasona's SimICE with physical migration tools are used in this methodology. The existing integrated circuits are manifested on a physical board t enable operation and test assessment, including the use of SimICE.

The pre-layed-out, pre-verified, existing integrated circuits (chips) physical design database, GDS 11, are re-layed-out in the target process technology (migrated), using physical migration tools such as Rubicad. The test is developed using SimICE. The scan chains can be integrated, chip I/O mapping to SOC I/O and parametric test can be done.

Three key steps in the flow are involved as show in the diagram: Step 1 has an existing board that has the chips (to migrate) on it. An SOC test socket exists, which is used with SimICE to develop the test model. Step 2 takes the refined test model to layout, making it available as a core, as well as doing the physical design migration at the GDS II level, of the chips to cores. Step 3 prepares the SOC for fabrication, fabricates the devise, and uses the devise on a huge integrated circuit target board.

The advantages of this invention are many. No functional simulation of existing designs is required, which dramatically speeds and simplifies development. The existing IC (integrated circuit) testing capability can be leveraged, refined and evolved, pins on the SOC IC can be minimized. If needed, the existing IC can be represented as a simulation model as opposed to just the GDS II layout. All silicon types can be intergrated using this methodology, includes memories, mixed signal, analog, I/O buffers. Greater than 1 million gate devices are enabled with this methodology, with the modular nature of the cores (the existing ICs), the physical migration tool is the only limitation on the size the cores can be; there are few barriers to building any number of cores on an SOC. Performance and testing can be done with this methodology with no SimICE models of the chips. Extraction of test patterns can be done from the bosrd using SimICE ansd the migrated chip can then be verified on the SOC with these patterns.

One million gate and larger ICs are inhibited by the limitations on the methodology and tool capabilities, not the process technologies. This invention provides the methodology to build these SOCs with a variety of silicon sources with integrated test, fast. This can translate to saving millions of dollars in man-years of a development and harvesting millions of dollars in early time to market with an SOC solution that works the first time in the target application.

What is claimed is:

1. An integrated circuit design system comprising:
   an original physical board with electronic integrated circuits, including socket means, said board used to develop a test model to be used in integration of the integrated circuits;
   means for said socket means to interface to a simulator;
   means for a simulating to simulate the test model with the operation of the original physical board with the integrated circuits;
   means for the test model to be manifested in layout, through HDL synthesis or a gate model or a transistor model, available as a core to be integrated with the integrated circuits;
   means for a test core, said test core developed from said test model, to be integrated with the integrated circuits, wherein the integrated circuits are migrated at the GDS II level circuit description such that simulation is not necessary to produce working silicon of all integrated circuits and the test model on a single integrated circuit;
   means for said single integrated circuit to functionally operate on a physical board.

2. A system, according to claim 1, further comprising: means for fabricating the single integrated circuit that represents an integration of all integrated circuits and the test core, said test core developed from said test model.

3. A system, according to claim 2, wherein the single integrated circuit is implemented on a physical board such that the operation is substantially the same as the original physical board.

4. A system, according to claim 2, further comprising: a design capability that facilitates the existing test capability of the integrated circuit to be integrated, including scan design.

5. Method for integrating an integrated circuit comprising: developing a test model to be used in integration of integrated circuits by using an original physical board with the electronic integrated circuits including socket means;

interfacing said socket means to a simulator;

simulating the test model with the operation of the original physical board with the integrated circuits;

translating the test model to be in layout, through HDL synthesis of a gate model or a transistor model, available as a core to be integrated with the integrated circuits;

integrating the test core, said test core developed from said test model, with the integrated circuits to be integrated, wherein the integrated circuits are migrated at the GDS II level circuit description, including a re-layout in a target process technology modifying said layout as needed, such that simulation is not necessary to produce fabricated working silicon of all integrated circuits and the test model on a single integrated circuit.

6. A method, according to claim 5, further comprising:

producing the single integrated circuit that represents an integration of all integrated circuits and the test model fabricated.

7. A method, according to claim 6, further comprising:

fabricating the single integrated circuit implemented on a physical board such that the operation is substantially the same as the original physical board.

8. A method, according to claim 6, further comprising:

designing a single integrated circuit such that existing test capabilities of the integrated circuit to be integrated is facilitated, including scan design.

* * * * *